United States Patent [19]
Cronin

[11] Patent Number: 5,539,230
[45] Date of Patent: Jul. 23, 1996

[54] CHIMNEY CAPACITOR

[75] Inventor: John E. Cronin, Milton, Vt.

[73] Assignee: International Business Machines Corporation, Armonk, N.Y.

[21] Appl. No.: 405,164

[22] Filed: Mar. 16, 1995

[51] Int. Cl.$^6$ .................................................. H01L 27/108
[52] U.S. Cl. .......................... 257/306; 257/309; 257/382
[58] Field of Search ...................................... 257/306, 307, 257/308, 309, 296

[56] References Cited

U.S. PATENT DOCUMENTS

| | | | |
|---|---|---|---|
| 4,650,544 | 3/1987 | Erb et al. | 156/653 |
| 5,061,650 | 10/1991 | Dennison et al. | 437/47 |
| 5,150,276 | 9/1992 | Gonzalez et al. | 361/313 |
| 5,200,635 | 4/1993 | Kaga et al. | 257/306 |
| 5,218,219 | 6/1993 | Ajika et al. | 257/309 |
| 5,234,855 | 8/1993 | Rhodes et al. | 437/47 |
| 5,284,787 | 2/1994 | Ahn | 437/52 |
| 5,292,677 | 3/1994 | Dennison | 437/47 |
| 5,414,655 | 5/1995 | Ozaki et al. | 257/306 |
| 5,497,016 | 3/1996 | Koh | 257/306 |

Primary Examiner—Robert P. Limanek
Attorney, Agent, or Firm—Heslin & Rothenberg

[57] ABSTRACT

A chimney capacitor is formed having two plates, of which each is disposed above and contacts a corresponding electrical contact. The electrical contacts facilitate electrical access to the plates of the chimney capacitor. One of the electrical contacts may comprise part of a general wiring layer that may be used for both electrically accessing the capacitor and for general wiring within the IC chip. Formation of the chimney capacitor proceeds by first forming two electrical contacts on an integrated circuit ("IC") chip. A planar insulating layer is formed thereover, and the capacitor is formed at least partially within the planar insulating layer such that each plate is electrically connected to a corresponding electrical contact.

11 Claims, 6 Drawing Sheets

CHIMNEY CAPACITOR

TECHNICAL FIELD

The present invention relates in general to capacitors in integrated circuit chips. More specifically, the present invention relates to a chimney capacitor and a method for fabrication thereof.

BACKGROUND OF THE INVENTION

In integrated circuit ("IC") chips, capacitors have many uses. As one example, an individual memory cell within an array of dynamic random access memories ("DRAMs") may comprise a capacitor coupled to a transistor. A binary one (1) is written to the DRAM cell by turning on the transistor and passing current therethrough to charge the capacitor. The storage state of the memory cell is read by turning on the transistor and reading the voltage level to which the capacitor is charged. If the voltage level exceeds a predetermined threshold, then a binary one is read, otherwise a binary zero is read. In such applications, it is desirable for the capacitor to store a large charge for a long time, making high capacitance and low leakage advantageous characteristics.

In early DRAMS, simple plate capacitors were used in the memory cells. A conductor, followed by a dielectric, followed by another conductor were deposited on the substrate of the IC chip forming a plate capacitor. As memory densities increased and memory cell size correspondingly decreased, this technology proved to occupy an impractical amount of space. One alternate technology was trench technology in which a trench was etched out of a silicon substrate, the side walls thereof oxidized to form a dielectric, and the trench filled with a conductor to thereby form a capacitor. Problems arose with this technology, however, as memory densities increased because the width of the trenches (i.e., cell size) decreased and the trench depths correspondingly increased to maintain capacitance. Quickly, the necessary trench depths are becoming impractical to achieve due to aspect ratio limitations of etching processes used to form the trenches. As is well known, narrow deep trenches are difficult to etch.

As trench capacitor technology developed, the plate, or stacked capacitor technology advanced as well. One type of stacked capacitor is a stud stacked capacitor in which a polysilicon stud is defined, coated with oxide (i.e., a dielectric), and then coated with a conformal layer of polysilicon. Unfortunately, the stud capacitor has low capacitance. Another stacked capacitor is a multiple layer planar stacked capacitor that includes alternating layers of polysilicon and oxide. The polysilicon layers are all connected on one side of the stack and the oxide is removed leaving horizontal, freestanding polysilicon "fingers." These "fingers" are oxidized and additional polysilicon is deposited between the fingers forming a second capacitor plate. Unfortunately, while freestanding, the fingers are very unstable such that the total number of possible layers is limited and a corresponding limitation on capacitance results.

In chimney capacitor structures, similar polysilicon "fingers" are used, however they typically comprise cylinders and are oriented vertically. Forming chimney capacitors conventionally involves depositing a mandrel, fabricating the polysilicon fingers with the use of the mandrel, and removing the mandrel leaving the vertical polysilicon fingers freestanding. A thin oxide is then deposited on the fingers as a dielectric, and the spaces between the fingers are filled with polysilicon forming a second capacitor plate that is electrically connected from above. A freestanding chimney capacitor is thus formed.

Conventional chimney capacitors have good capacitance and leakage characteristics; however, they are not without problems. Electrical contact to one of the plates of a chimney capacitors is conventionally made to the upper surface of a chimney capacitor. Wiring must therefore be performed above the chimney capacitor and circuitry located therebelow. This causes planarization concerns for the subsequent wiring levels, increases the number of processes necessary to complete wiring of the IC chip containing the chimney capacitors and makes use of an available upper wiring level. Thus, the wireability of IC chips containing conventional chimney capacitors is limited.

During fabrication, physical stability of the freestanding structures is a crucial problem. As the chimney capacitor becomes higher, it becomes less stable and is more likely to collapse during the fabrication processes. Further, it is often desirable to deposit a thick conformal layer of oxide over the chimney capacitors on an IC chip and planarize the oxide. The planar upper surface of the oxide simplifies wiring of the devices. However, the topography of chimney capacitors on a DRAM IC chip causes planarization problems as the chimneys become higher. Specifically, the height differential between the chimneys and surrounding logic areas impedes both the deposition, and planarization of a conformal oxide layer. Even if the planarized insulating layer is established, various openings down to the transistors of the DRAM chip must then be provided for wiring thereof. Etching these openings becomes problematic as the chimney height (and corresponding insulating layer thickness) increases. This is due to high aspect ratio etch problems.

To summarize, the overall wireability, height and corresponding capacitance of conventional chimney capacitor structures are limited. The present invention is directed toward providing solutions for the above-noted problems.

DISCLOSURE OF THE INVENTION

Briefly described, in a first aspect, the present invention comprises a circuit structure in an integrated circuit ("IC") chip. The circuit structure includes a capacitor that has a first plate and a second plate. A first electrical contact is at least partially disposed beneath and electrically contacts the first plate of the capacitor, while a second electrical contact is at least partially disposed beneath and electrically contacts the second plate of the capacitor. The first electrical contact and the second electrical contact facilitate electrical access to the plates of the capacitor.

As enhancements, the capacitor may comprise a chimney capacitor. Further, the first plate may comprise multiple portions including an outer circumferential portion and the second plate may comprise an inner circumferential portion of the chimney capacitor. In such a case, the first electrical contact is at least partially disposed beneath and electrically contacts the first plate, while the second electrical contact is at least partially disposed beneath and electrically contacts the second plate. Even further, the first electrical contact may comprise part of a conductive layer that is partially disposed beneath the outer circumferential portion of the chimney capacitor for facilitating electrical access thereto.

The present invention further comprises a method for forming the circuit structure that includes the capacitor having the first electrical contact and the second electrical contact. The method includes fabricating the first electrical contact and the second electrical contact as part of the IC chip. The capacitor is formed such that the first electrical contact is at least partially disposed beneath and electrically contacts the first plate of the capacitor and the second electrical contact is at least partially disposed beneath and electrically contacts the second plate of the capacitor. Again, the first electrical contact and the second electrical contact facilitate electrical access to the plates of the capacitor.

The present invention has many advantages and features associated with it. The chimney capacitor of the present invention is electrically connected to electrical contacts located beneath the plates of the capacitor such that wiring above the capacitors is available for other purposes. Further, a wiring level containing one of the electrical contacts may be used for general wiring in IC chip areas where electrical contact to a capacitor plate is unnecessary. In implementation, an insulator layer that will surround the chimney capacitor is formed before the capacitor plates such that insulator does not have to be filled around freestanding chimney capacitors. Stability of the structure during fabrication is therefore enhanced. Thus, the present invention represents an overall advancement in IC chip capacitors.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

Figure 7:
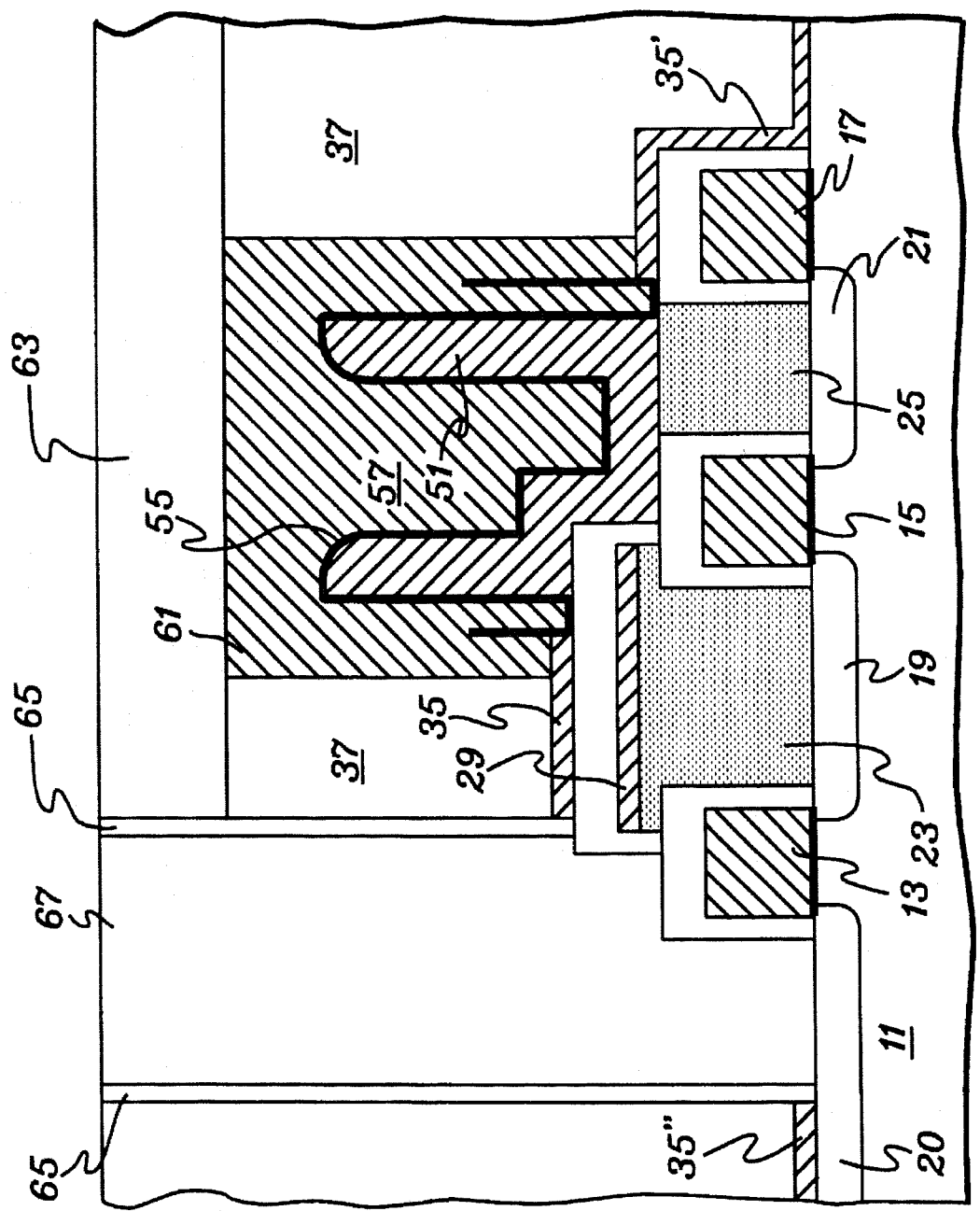
FIG. 7 is a cross-sectional view of the DRAM cell of FIG. 6 after completion of fabrication pursuant to one embodiment of the present invention.

The techniques of the present invention facilitate the formation of a DRAM cell having a chimney stacked capacitor. Shown in FIG. 7 is one embodiment of the DRAM cell of the present invention. The chimney capacitor has a first plate 51 and a second plate (comprising elements 57 and 61) separated by a dielectric 55. The 'crown' shape of dielectric 55 contributes to the high capacitance of the capacitor. Specifically, the multiple bends in the dielectric provides a large area between the two plates, thus providing high capacitance while maintaining a capacitor with a relatively low aspect ratio geometry. Although shown in cross-section, the capacitor may have any shape into the page.

As is well known, one plate of the capacitor of a DRAM cell is electrically grounded while the other plate connects to a current carrying terminal (i.e., source/drain) of the cell transistor. In the capacitor of the present invention, the ground connection is provided by a P+ doped polysilicon layer 35 that electrically contacts capacitor plate 57/61. Polysilicon layer 35 is provisioned over the entire surface early in the fabrication process and is removed where necessary for other connections and/or isolation. Portions 35' and 35" of polysilicon layer 35 are electrically connected to other portions of polysilicon layer 35 outside of the cross-section shown. The current carrying transistor terminal connection is provided by a polysilicon stud 25 that electrically connects capacitor plate 51 to a transistor diffusion region 21 (i.e., source/drain). Both polysilicon layer 35 and stud 25 electrically contact the capacitor at bottom portions thereof, below the plates, and are formed before the capacitor as will be explained further hereinbelow. Advantageously, by providing wiring to the capacitor below it, wiring space above the capacitor is available for other uses.

The chimney capacitor of the DRAM cell has a planar upper surface that is coplanar with an upper surface of an insulating layer 37 within which the capacitor is contained. The planarity of the upper surfaces facilitates deposition of further structures (such as an insulating layer 63) above which conventional wiring/metallization can be applied. Advantageously, the process steps to form wiring/metallization on a planar upper surface are simpler than those required to form wiring/metallization on surfaces with irregular topographies.

Other features of the DRAM cell of FIG. 7 include the cell transistor that comprises diffusion regions 19 and 21, and a polysilicon gate 15. Gate 15 is the wordline of the DRAM cell, while a P+ polysilicon layer 29 electrically connected to diffusion 19 through a polysilicon stud 23 and functions as the bitline of the DRAM cell. To note, the bitline 29 joins many DRAM cells together, passing in a horizontal direction outside the cross-section shown. The wordline 15 passes underneath the bitline in a direction in/out of the cross-section shown. A conductive stud 67 that is insulated by an oxide 65 is used to contact, for example, a diffusion 20 (of a transistor of an adjacent memory cell) from the upper surface of the DRAM cell. Other conductive studs (not shown) facilitate electrical contact with the bitline comprising polysilicon layer 29 outside of the cross-section shown from wiring levels above the chimney capacitor.

Figure 1:
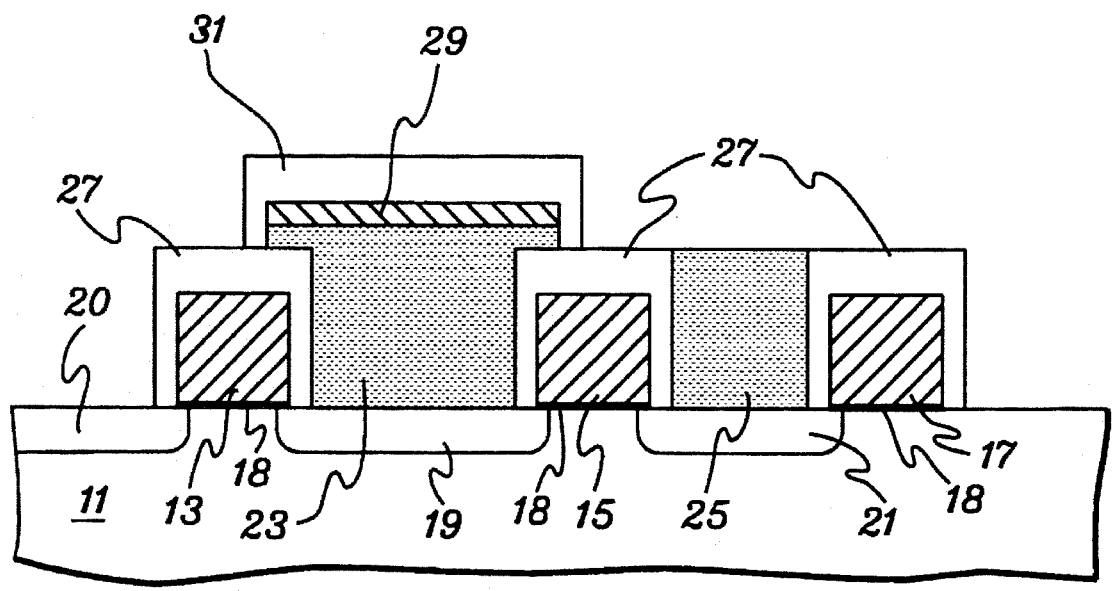
FIG. 1 is a cross-sectional view of a fabrication stage of a DRAM cell pursuant to one embodiment of the present invention.

The process for fabricating one embodiment of the DRAM cell with the chimney capacitor of the present invention begins with a conventional DRAM cell transistor structure (FIG. 1). The DRAM cell transistor structure shown is a well-known structure of which the fabrication thereof will be apparent to one of ordinary skill in the art. Specifically, one example of the DRAM cell transistor can be found in "Crown-Shaped Stacked Capacitor Cell for 1.5 V Operation 64 Mb DRAM's," by Kaga et al., IEEE Transactions on Electron Devices, Vol. 38C No. 2, February 1991, incorporated herein by reference in its entirety.

The structure of FIG. 1 includes three gates, namely a gate 13, a gate 17, and gate 15. The gates are each formed over a thin oxide layer 18 on a substrate 11 that has diffusions 19, 20 and 21 therein. Contacting diffusion 21 is stud 25, while stud 23 electrically connects diffusion 19 to polysilicon layer (bitline) 29. Each gate is covered by oxide layer 27 and the bitline 29 is covered by oxide layer 31.

Figure 2:
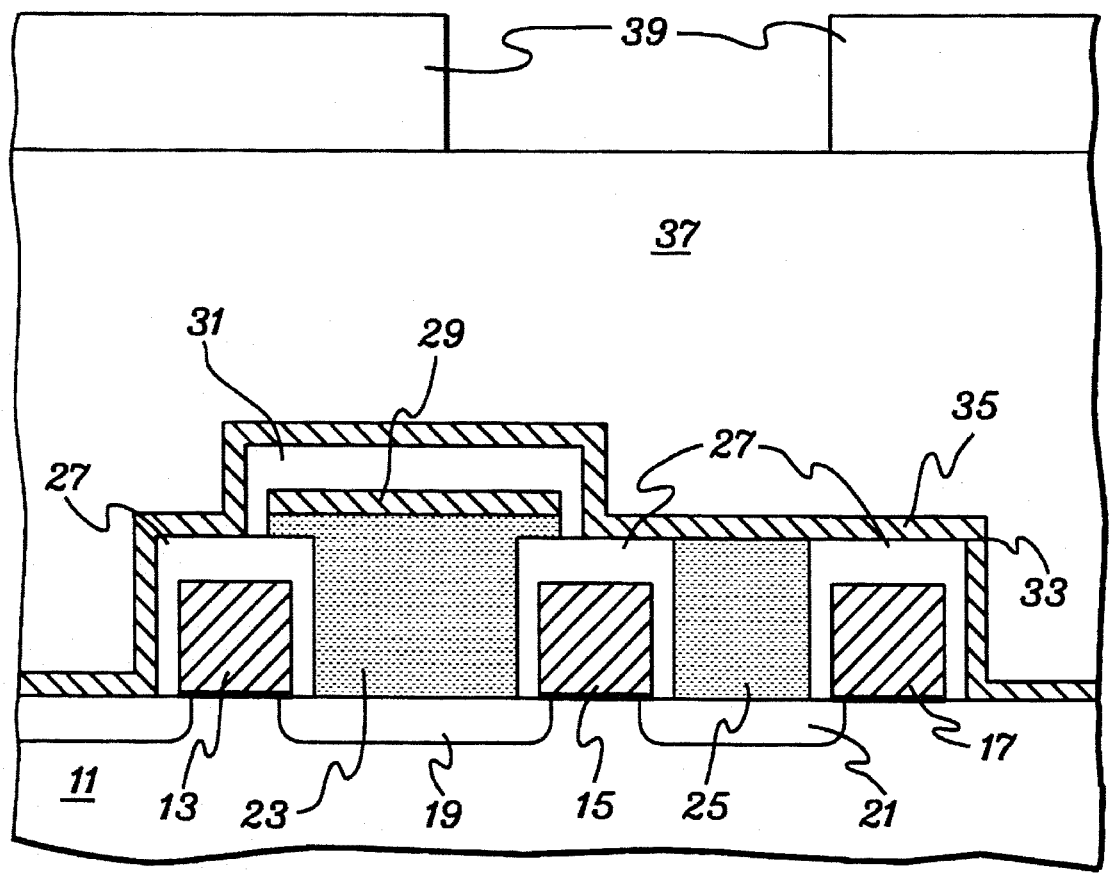
FIG. 2 is a cross-sectional view of the DRAM cell of FIG. 1 after the formation of a planarized insulating layer and an overlying node mask according to an embodiment of the present invention.

A next step in the fabrication process includes depositing a thin oxide layer 33 (FIG. 2) over the transistor structure, followed by a P+ doped polysilicon layer 35. A mask and etch process is then used to define the polysilicon 35/oxide 33 layers. The polysilicon layer 35 will function as the ground connection to a plate of capacitors on the IC chip and is appropriately defined to connect thereto in a manner that will be apparent to one of ordinary skill in the art. As enhancements, the polysilicon layer 35 could be silicided to improve conductivity or could alternately comprise a metal layer. Further, in areas of the IC chip where a ground connection is not needed, polysilicon layer 35 could function as a wiring layer.

The fabrication process continues with the deposition and planarization of a thick insulating layer 37 over the existing structure. Planarization may be performed by, for example, Chemical Mechanical Polishing ("CMP"). After that, a node mask 39 is defined on the upper surface of insulating layer 37. The node mask may be fabricated, for example, by depositing a layer of aluminum over insulating layer 37, and using a mask/etch process to define appropriate openings in the aluminum layer forming a node mask 39. The openings are located, for example, at positions wherein chimney capacitors are to be located.

Figure 3:
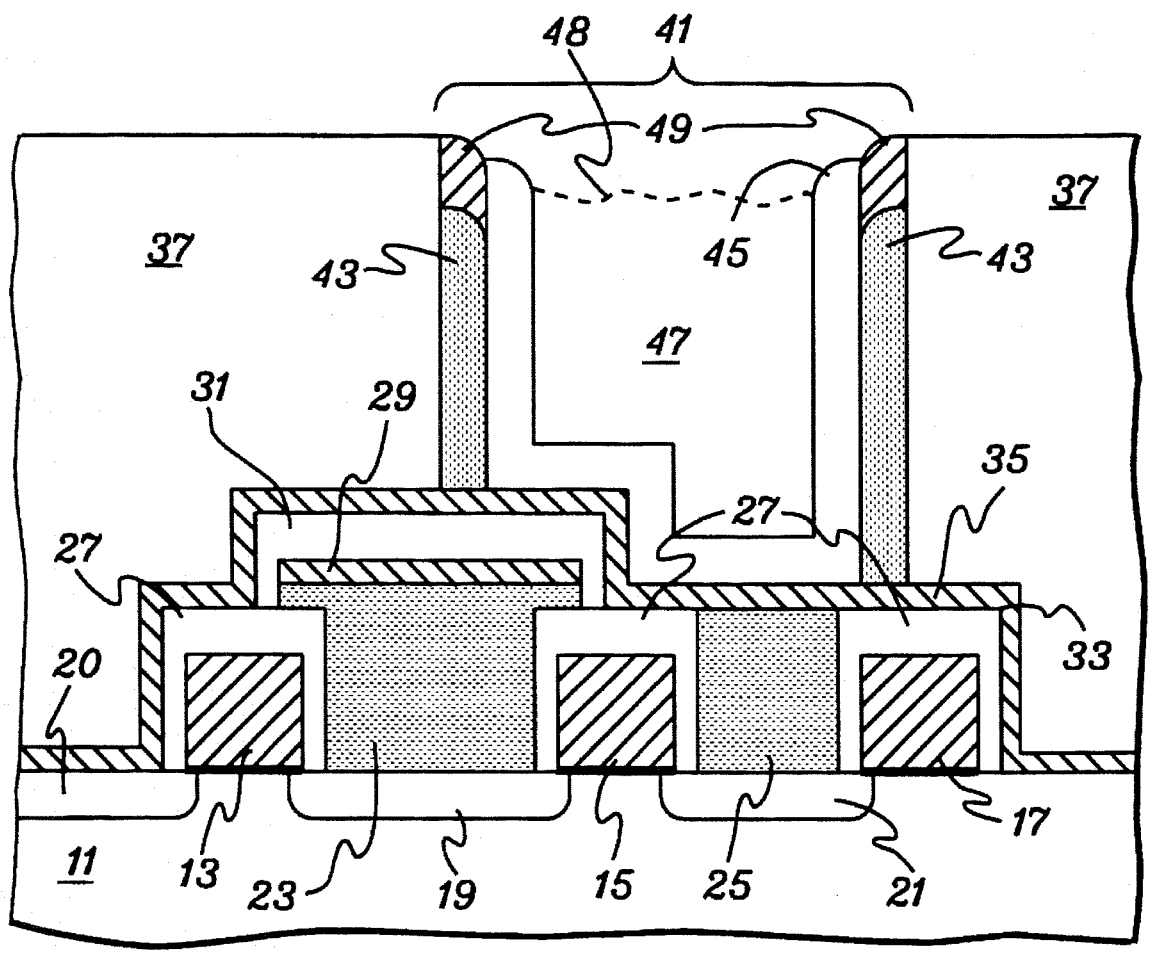
FIG. 3 is a cross-sectional view of the DRAM cell of FIG. 2 after formation of a capacitor opening and structures therein in conformance with one embodiment of the present invention.

A dry etch is performed through node mask 39 down to P+ polysilicon layer 35 defining a capacitor opening 41.(FIG. 3). As one example, the dry etch process may comprise a Reactive Ion Etching ("RIE") process that is selective to P+ polysilicon. The node mask 39 is removed and a layer of intrinsic polysilicon 49 ("I-polysilicon") is conformally deposited over insulator 37 and within opening 41. A further dry etch process is used to remove the I-polysilicon from all horizontal surfaces leaving a bottomless cylinder comprising I-polysilicon spacer 43 within opening 41 (note: the I-polysilicon spacer 43 is shown having oxidized upper portions 49, discussed below).

To continue, a layer of silicon nitride ($Si_3N_4$) 45 is conformally deposited over the existing structure, covering insulating layer 37 and I-polysilicon spacer 43. A resist 47 (or, for example, organic compound) is then deposited over the silicon nitride 45, filling opening 41. Using a selective etch comprising, for example, a plasma ash etch, the resist is etched back to level 48 within opening 41. Then, using a further selective etch comprising, for example, a $CF_4$ in oxygen etch, the silicon nitride 45 is etched to the level of resist 47 in opening 41 such that silicon nitride 45 having a "U" shaped cross-section remains within opening 41. The resist is then removed by, for example, a plasma ash etch, and the upper portions 49 of the I-polysilicon spacers 43 are oxidized.

Figure 4:
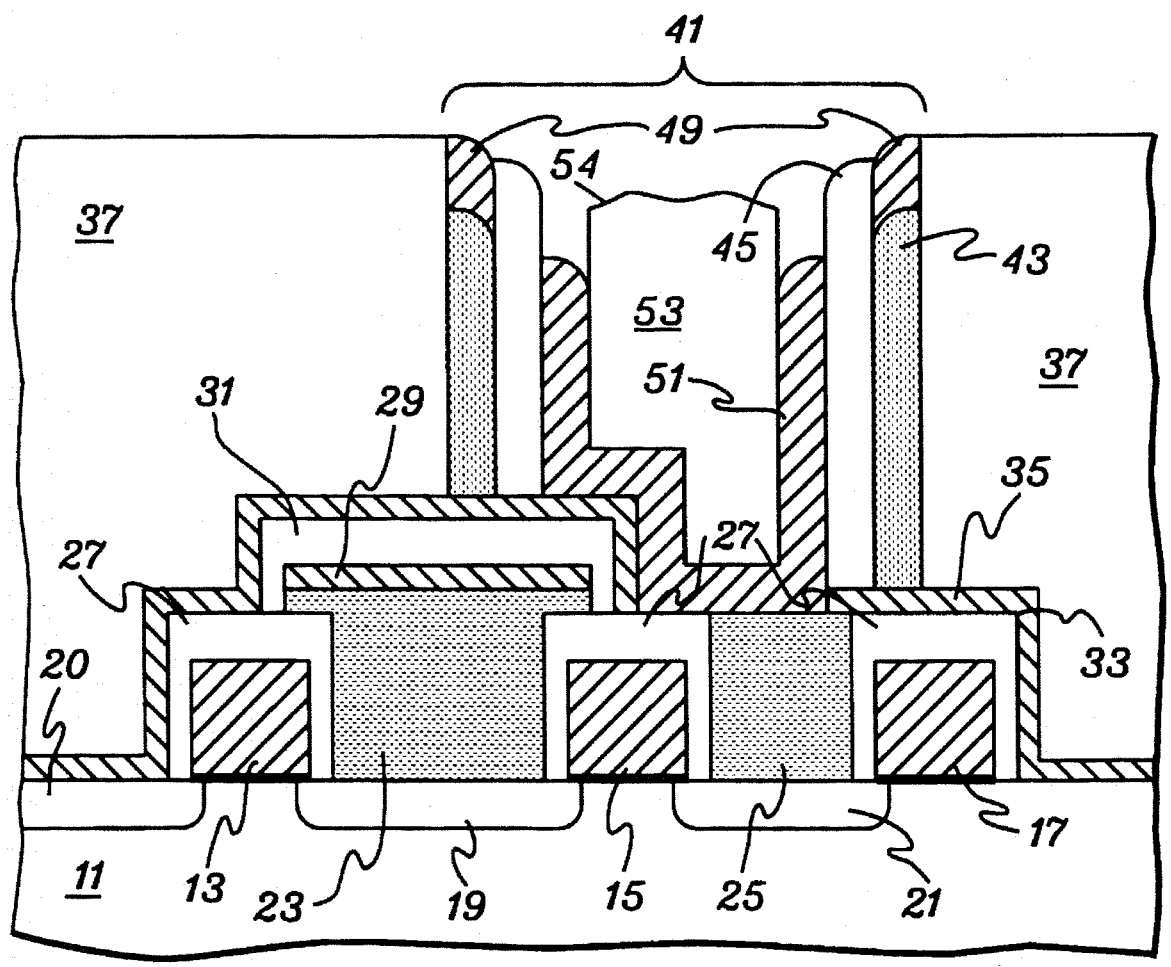
FIG. 4 is a cross-sectional view of the DRAM cell of FIG. 3 with additional capacitor structures formed in the capacitor opening pursuant to an embodiment of the present invention.

A selective dry etch is used in a further process step to etch through the bottom of silicon nitride 45, P+ polysilicon layer 35 and thin oxide 33 reaching P+ polysilicon stud 25 and oxide 31 (FIG. 4). A P+ polysilicon layer 51 is then conformally deposited above previous structures, and a resist 53 is applied thereabove, and within opening 41. The resist is etched back to a level 54 using, for example, a plasma ash etch. Thereafter, using an etch that is selective to oxide and to nitride, P+ polysilicon layer 51 is etched to just below level 54 of the resist. Remaining resist 53 may then be removed. The P+ polysilicon layer 51 will function as one plate of the capacitor.

Figure 5:
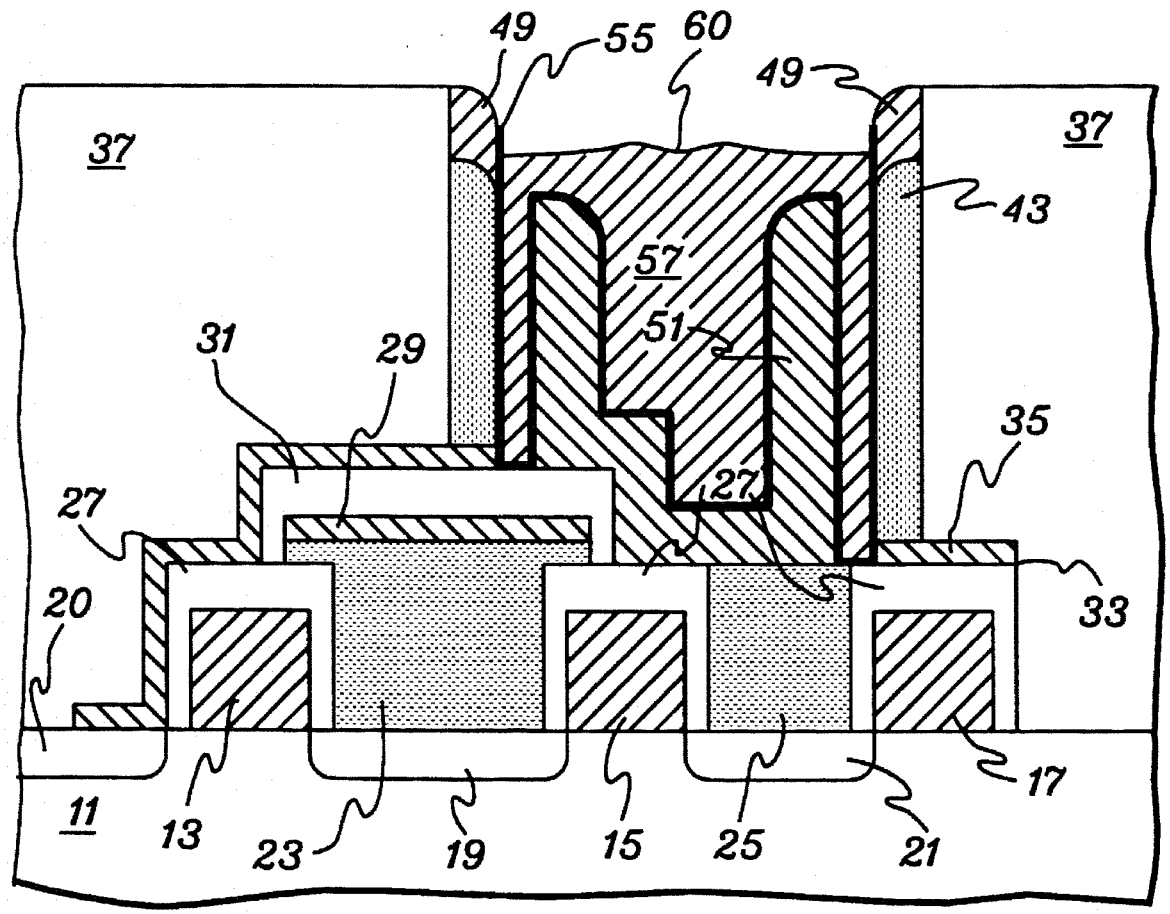
FIG. 5 is a cross-sectional view of the DRAM cell of FIG. 4 following the formation of the capacitor dielectric and other capacitor structures in accordance with one embodiment of the present invention.

At this stage in the process, the silicon nitride layer 45 may be removed by a selective dip comprising, for example, hot phosphoric acid. A dry etch selective to oxide is then used to remove portions of P+ polysilicon layer 35 from areas under which the silicon nitride layer 45 used to be. As an example, a RIE process may be used to remove these portions. This results in the electrical disconnection of the plates of the capacitor that were electrically connected by a portion of P+ polysilicon layer 35. Specifically, an inner cylindrical plate comprising P+ polysilicon layer 51 is disconnected from an outer cylindrical plate comprising I-polysilicon layer 43 (that is subsequently going to be at least partially replaced by a heavily doped polysilicon layer). As a result of the disconnection, it can be observed (FIG. 5) how the inner plate 51 electrically contacts diffusion 21 through stud 25 (i.e., the cell transistor), while the outer plate 43 separately electrically contacts polysilicon layer 35 (i.e., ground).

The node dielectric 55 is next created by oxidizing the entire structure and depositing a dielectric material such as, for example, $Al_2O_3$ thereon. A P+ polysilicon layer/fill 57 is then deposited, conformally coating the entire structure, and filling opening 41. Thereafter, the surface of the structure is polished, removing the P+ polysilicon 57 and dielectric 55 from the planar upper surface of insulator 37. A dry etch comprising, for example, a RIE process is then used to recess P+ polysilicon 57 to a level 60.

Note that after removal of the silicon nitride 45, and before filling with P+ polysilicon 57, the inner cylinder comprising P+ polysilicon layer 51 is freestanding. However, to avoid any vibration and stability problems, the silicon nitride 45 could have been selectively dry etched and the oxidation/dielectric deposition and P+ polysilicon 57 fill/etch could have been performed without moving the wafer.

Figure 6:
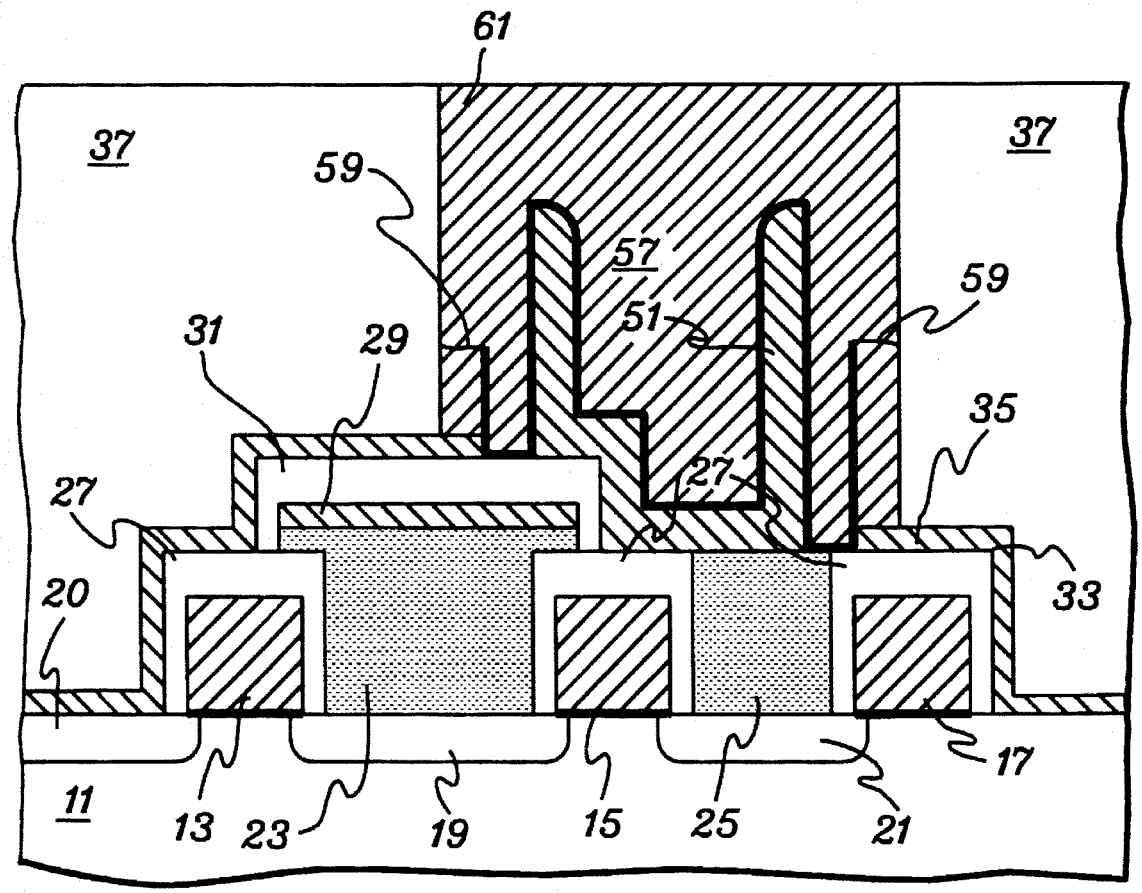
FIG. 6 is a cross-sectional view of the DRAM cell of FIG. 5 after completion of fabrication of the capacitor in conformance with an embodiment of the present invention.

An etch that is selective to oxide and P+ polysilicon is used to recess the I-polysilicon 43 to a level 59 (FIG. 6). A corresponding portion of oxide layer 55 may also be removed to level 59 by a selective dip process. Further, P+ polysilicon 61 is deposited in the space where I-polysilicon 49 was removed from, and the planar upper surface of insulating layer 37 is planarized thus removing excess P+ polysilicon 61 thereon. This deposition provides a P+ doping of the remaining I-polysilicon 43 enhancing conductivity therethrough. The chimney capacitor of the present invention is accordingly complete.

As final process steps, a second thick insulating layer 63 is deposited above insulating layer 37 (FIG. 7) and is planarized. The second insulating layer 63 may comprise, for example, an oxide. A contact hole may then be etched through insulating layer 63, insulating layer 37 and P+ polysilicon layer 35 to oxide layers 31 and 27 and substrate 11. The inside walls of the contact hole are lined with an oxide 65 by, for example, depositing a conformal layer of oxide followed by an RIE process. Thereafter, the contact hole is filled with metal 67, and the upper surface of the structure is again planarized to remove excess material (e.g., metal 67). In this example, the contact hole provides access to diffusion 20 from the upper metallization layers (not shown).

To summarize, the present invention has many advantages and features associated with it. The chimney capacitor of the present invention is electrically connected to electrical contacts located beneath the plates of the capacitor such that wiring above the capacitors is available for other purposes. Further, a wiring level containing one of the electrical contacts may even be used for general wiring in IC chip areas where electrical contact to a capacitor plate is unnecessary. In implementation, an insulator layer that will surround the chimney capacitor is formed before the capacitor plates such that insulator does not have to be filled around freestanding chimney capacitors. Stability of the structure during fabrication is therefore enhanced. Thus, the present invention represents an overall advancement in IC chip capacitors.

While the invention has been described in detail herein, in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In an integrated circuit ("IC") chip, a circuit structure comprising:

a capacitor having a first plate and a second plate;

a first electrical contact at least partially disposed beneath and electrically contacting said first plate of said capacitor; and a second electrical contact at least partially disposed beneath and electrically contacting said second plate of said capacitor, wherein said first electrical contact and said second electrical contact facilitate electrical access to said first plate and said second plate of said capacitor.

2. The circuit structure of claim 1, wherein said capacitor comprises a chimney capacitor.

3. The circuit structure of claim 2, wherein said first plate comprises multiple portions, said first plate comprising an outer circumferential portion of said multiple portions and said second plate comprises an inner circumferential portion of said chimney capacitor such that said first electrical contact is at least partially disposed beneath and electrically contacts said outer circumferential portion of said first plate and said second electrical contact is at least partially disposed beneath and electrically contacts said inner circumferential portion of said chimney capacitor.

4. The circuit structure of claim 3, wherein said first electrical contact comprises part of a general purpose conductive layer.

5. The circuit structure of claim 4, wherein the outer circumferential portion of said first plate of said chimney capacitor resides above and does not extend laterally beyond said conductive layer.

6. The circuit structure of claim 5, wherein the conductive layer has a circular opening therein and wherein said chimney capacitor is disposed partially within the circular opening of the conductive layer.

7. The circuit structure of claim 6, wherein portions of the chimney capacitor within the outer circumferential portion of the first plate extend into the circular opening of the conductive layer.

8. The circuit structure of claim 4, wherein said circuit structure comprises a memory cell, said circuit structure further comprising a bitline that is electrically connected to said chimney capacitor through a transistor, said bitline having a portion disposed beneath said conductive layer in a region beneath said outer circumferential portion of said chimney capacitor.

9. The circuit structure of claim 8, further comprising a wordline that is electrically connected to the chimney capacitor through said transistor, said wordline having a portion disposed beneath said bitline.

10. The circuit structure of claim 9, wherein said wordline passes beneath said chimney capacitor for functioning in conjunction with multiple memory cells.

11. The circuit structure of claim 4, wherein said first plate further comprises a secondary circumferential portion of said chimney capacitor disposed between said outer circumferential portion of said first plate of said chimney capacitor and said inner circumferential portion of said chimney capacitor, a portion of said secondary circumferential portion being separated from said outer circumferential portion by a dielectric layer, said dielectric layer being disposed between said conductive layer and said secondary circumferential portion such that said conductive layer is physically separated from said secondary circumferential portion of said chimney capacitor.

* * * * *